United States Patent
Lee

(10) Patent No.: US 9,722,597 B2
(45) Date of Patent: Aug. 1, 2017

(54) INITIALIZATION SIGNAL GENERATION DEVICE AND NONVOLATILE MEMORY APPARATUS USING THE SAME

(71) Applicant: SK hynix Inc., Icheon-si Gyeonggi-do (KR)

(72) Inventor: Hyun Chul Lee, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/008,784

(22) Filed: Jan. 28, 2016

(65) Prior Publication Data

US 2017/0085261 A1    Mar. 23, 2017

(30) Foreign Application Priority Data

Sep. 21, 2015    (KR) .................. 10-2015-0132888

(51) Int. Cl.
*H03L 7/00*         (2006.01)
*H03K 17/22*     (2006.01)

(52) U.S. Cl.
CPC .................. *H03K 17/223* (2013.01)

(58) Field of Classification Search
CPC .................................................... H03K 17/223
See application file for complete search history.

(56) References Cited

U.S. PATENT DOCUMENTS

| 6,901,012 B2 | 5/2005 | Ikehashi et al. |
| 7,602,225 B2 | 10/2009 | Seo et al. |
| 2015/0155854 A1* | 6/2015 | Hayasaka ................ G06F 1/26 327/143 |

* cited by examiner

*Primary Examiner* — Daniel Puentes
(74) *Attorney, Agent, or Firm* — William Park & Associates Ltd.

(57) ABSTRACT

An initialization signal generation device may be provided. The initialization signal generation device may include a power supply circuit configured to provide one of an external voltage and an internal voltage in response to an initialization signal. The initialization signal generation device may include an initialization signal generator configured to sense the level of the voltage outputted from the power supply circuit and generate the initialization signal.

16 Claims, 7 Drawing Sheets

INITIALIZATION SIGNAL GENERATION DEVICE AND NONVOLATILE MEMORY APPARATUS USING THE SAME

CROSS-REFERENCES TO RELATED APPLICATION

The present application claims priority under 35 U.S.C. §119(a) to Korean application number 10-2015-0132888, filed on Sep. 21, 2015, in the Korean Intellectual Property Office, which is incorporated herein by reference in its entirety.

BACKGROUND

1. Technical Field

Various embodiments generally relate to a semiconductor apparatus, and more particularly, to an initialization signal generation device of a nonvolatile memory apparatus.

2. Related Art

Semiconductor apparatuses are used in various electronic circuits. Among the semiconductor apparatuses, DRAM (Dynamic Random Access Memory) may perform a function of storing data through communication with a processor. DRAM may include a memory cell having a capacitor, and stores data by charging and discharging the memory cell. However, DRAM has a volatile characteristic allowing for its data to be lost when power supply is cut off due to a leakage current of the capacitor. In order to make up for the shortcomings of DRAM, a variety of nonvolatile memory apparatuses capable of maintaining data stored therein even though its power supply is cut off has been developed.

The nonvolatile memory apparatuses may be classified into PRAM (Phase Change RAM), MRAM (Magnetic RAM), RRAM (Resistive RAM), and FRAM (Ferroelectric RAM) according to the types of memory cells. PRAM, MRAM, RRAM, and FRAM are next-generation memories which can be operated at high speed while having a nonvolatile characteristic. Among the nonvolatile memory apparatuses, the use of FLASH memory capable of storing large-volume data using a floating gate has continuously increased. The semiconductor apparatuses are operated by power received from an external device, for example, a power supply and/or power management integrated circuit (IC). When power is applied, the semiconductor apparatuses can detect the level of the power and generate an initialization signal for initializing internal circuits of the semiconductor apparatuses.

DETAILED DESCRIPTION

Various embodiments may be directed to an initialization signal generation device capable of sensing an external voltage and an internal voltage and generating an initialization signal and a nonvolatile memory apparatus using the same.

In an embodiment, an initialization signal generation device may be provided. The initialization signal generation device may include a power supply circuit configured to provide one of an external voltage and an internal voltage in response to an initialization signal. The initialization signal generation device may include an initialization signal generator configured to sense the level of the voltage outputted from the power supply circuit and generate the initialization signal.

In an embodiment, an initialization signal generation device may be provided. The initialization signal generation device may include a power supply circuit configured to provide one of an external voltage and an internal voltage in response to an active signal. The initialization signal generation device may include an initialization signal generator configured to sense the level of the voltage outputted from the power supply circuit and generate the initialization signal.

Hereinafter, an initialization signal generation device and a nonvolatile memory apparatus including the same according to the present disclosure will be described below with reference to the accompanying drawings through various examples of embodiments.

Figure 1:
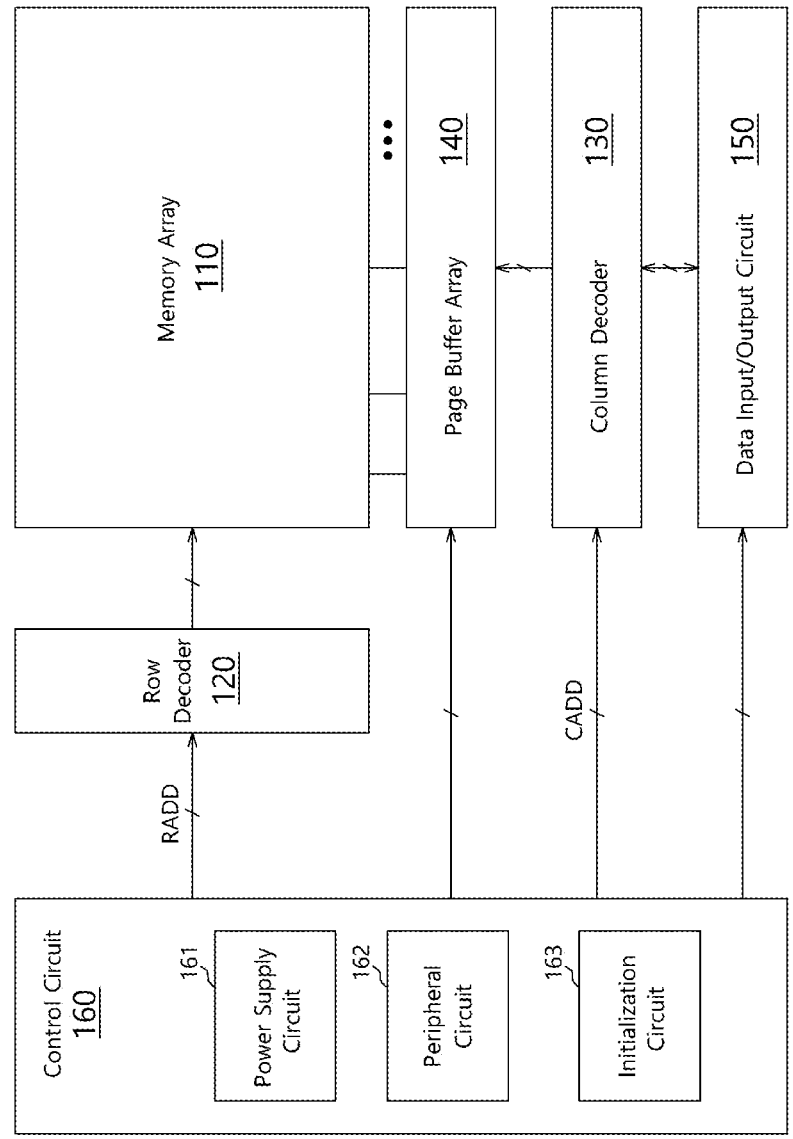
FIG. 1 is a diagram illustrating a representation of an example of the configuration of a nonvolatile memory apparatus in accordance with an embodiment.

FIG. 1 is a diagram illustrating a representation of an example of the configuration of a nonvolatile memory apparatus 1 in accordance with an embodiment. Referring to FIG. 1, the nonvolatile memory apparatus 1 may include a memory cell array 110, a row decoder 120, a column decoder 130, a page buffer array 140, a data input/output circuit 150, and a control circuit 160. The memory cell array 110 may include a plurality of memory strings and a plurality of word lines and bit lines coupled to the plurality of memory strings. The row decoder 120 may select a word line coupled to a specific memory cell based on a row address signal RADD. The column decoder 130 may select a word line coupled to a specific memory cell based on a column address signal CADD. The page buffer array 140 may store data in a memory cell accessed by the row decoder 120 and the column decoder 130 or output data stored in the memory cell. The data input/output circuit 150 may provide data inputted through a data transmission line to the page buffer array 140 or output data from the page buffer array 140 to the data transmission line.

The control circuit 160 may control the row decoder 120, the column decoder 130, the page buffer array 140, and the data input/output circuit 150. The control circuit 160 may include various logic circuits. The control circuit 160 may not be specifically limited, but may include a voltage supply circuit 161, a peripheral circuit 162, and an initialization circuit 163, for example. The voltage supply circuit 161 may generate and supply various voltages used in the nonvolatile memory apparatus 1. For example, the voltage supply circuit 161 may generate a read voltage, a program voltage, an erase voltage, and a word line voltage, and generate an internal voltage for operating an internal circuit of the nonvolatile memory apparatus 1. The voltage supply circuit 161 may receive one or more external voltages from outside the nonvolatile memory apparatus, and generate various voltages.

The peripheral circuit 162 may include various logic circuits for controlling the nonvolatile memory apparatus 1. For example, the peripheral circuit 162 may include a data buffer, an address buffer, and a chip enable unit. The initialization circuit 163 may initialize the nonvolatile memory apparatus 1 when power is applied to the nonvolatile memory apparatus 1. The initialization circuit 163 may sense the level of the power and generate the initialization signal.

Figure 2:
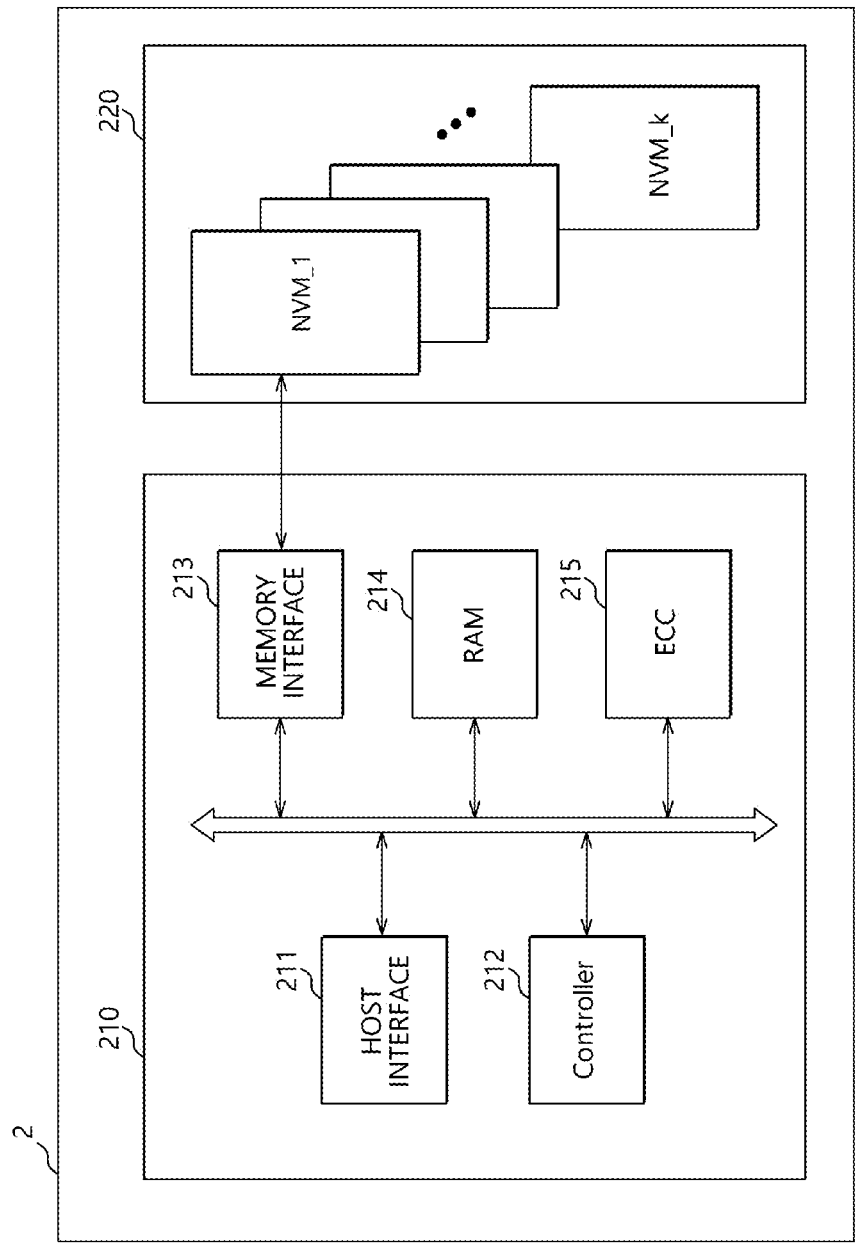
FIG. 2 is a diagram illustrating a representation of an example of the configuration of a data storage device according to an embodiment.

FIG. 2 is a diagram illustrating a representation of an example of the configuration of a data storage device 2 according to an embodiment. The data storage device 2 may include a controller 210 and a nonvolatile memory apparatus 220. The data storage device 2 may be connected to a host device (not illustrated) such as, but not limited to, a mobile phone, an MP3 player, a laptop computer, a desktop computer, a game machine, a TV, or an in-vehicle infotainment system.

The controller 210 may be configured to access the nonvolatile memory apparatus 220 in response to a request from the host device. For example, the controller 210 may be configured to control a read, program, or erase operation of the nonvolatile memory apparatus 220. The controller 210 may be configured to drive firmware or software for controlling the nonvolatile memory apparatus 220.

The controller 210 may include a host interface 211, a controller 212, a memory interface 213, a RAM 214, and an ECC (Error Correction Code) 215.

The controller 212 may be configured to control overall operations of the controller 210 in response to a request of the host device.

The RAM 214 may be used as a working memory of the controller 212. The RAM 214 may be used as a buffer memory which temporarily stores data read from the nonvolatile memory apparatus 220 or data provided from the host device.

The host interface 211 may be configured to interface the host device and the controller 210. For example, the host interface 211 may be configured to communicate with the host device through one of various interface protocols such as, but not limited to, a USB (Universal Serial Bus) protocol, a UFS (Universal Flash Storage) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial Advanced Technology Attachment) protocol, a SCSI (Small Computer System Interface) protocol, and a SAS (Serial Attached SCSI) protocol.

The memory interface 213 may be configured to interface the controller 210 and the nonvolatile memory apparatus 220. The memory interface 213 may be configured to provide a command and address to the nonvolatile memory apparatus 220. The memory interface 213 may be configured to exchange data with the nonvolatile memory apparatus 220.

The ECC 215 may be configured to detect an error of the data read from the nonvolatile memory apparatus 220. The ECC 215 may correct a detected error, when the detected error falls within a correction range. The ECC 215 may be implemented by a suitable combination of hardware and/or software including an error correction code. For example, the ECC 215 may be at least part of a storage medium with a suitable error correction code stored therein and/or circuitry designed to perform error correction.

The nonvolatile memory apparatus 220 may be used as a storage medium of the data storage device 2. The nonvolatile memory apparatus 220 may include a plurality of nonvolatile memory chips (or dies) NVM_1 to NVM_k.

The controller 210 and the nonvolatile memory apparatus 220 may be fabricated as any one of various data storage storages. For example, the controller 210 and the nonvolatile memory apparatus 220 may be integrated in one semiconductor apparatus, and fabricated as any one of, but not limited to, a multi-media card such as MMC, eMMC, RS-MMC, or micro-MMC, a secure digital card such as SD, mini-SD, or micro-SD, a USB storage device, a UFS device, a PCMCIA (Personal Computer Memory Card International Association) card, a CF (Compact Flash) card, a smart media card, and a memory stick.

Figure 3:
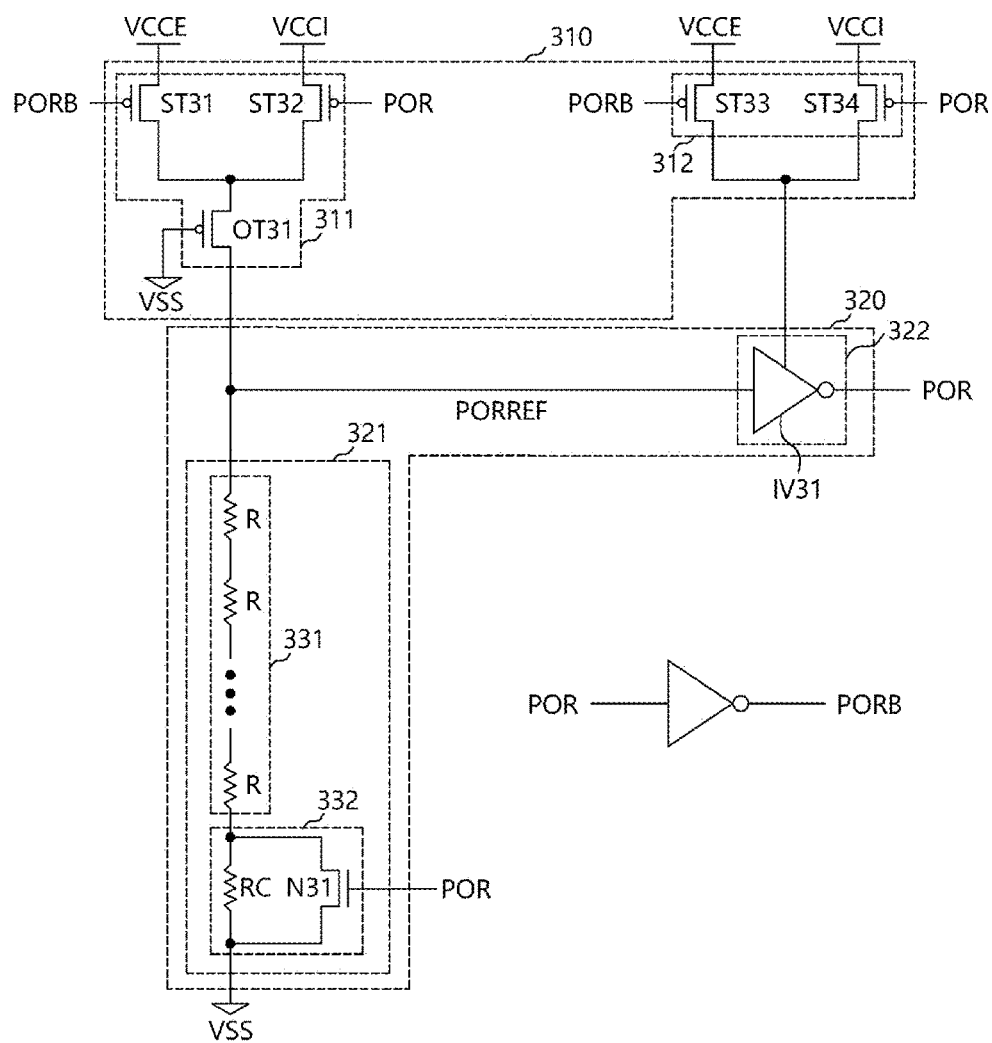
FIG. 3 is a diagram illustrating a representation of an example of the configuration of an initialization signal generation device according to an embodiment.

FIG. 3 is a diagram illustrating a representation of an example of the configuration of an initialization signal generation device 300 according to an embodiment. The initialization signal generation device 300 may be applied as the initialization circuit 163 of the nonvolatile memory apparatus 1 illustrated in FIG. 1. Referring to FIG. 3, the initialization signal generation device 300 may include a power supply circuit 310 and an initialization signal generator 320. The power supply circuit 310 may receive an external voltage VCCE and an internal voltage VCCI. The internal voltage VCCI may have a lower level than the external voltage VCCE. The power supply circuit 310 may selectively provide one of the external voltage VCCE and the internal voltage VCCI in response to an initialization signal POR. The external voltage VCCE may correspond to external power which the nonvolatile memory apparatus including the initialization signal generation device 300 receives from an external power supply and/or power management IC. The internal voltage VCCI may correspond to internal power generated from the external voltage VCCE in the nonvolatile memory apparatus. For example, the power supply circuit 310 may provide the external voltage VCCE when the initialization signal POR is enabled, and provide the internal voltage VCCI when the initialization signal POR is disabled.

The initialization signal generator 320 may generate the initialization signal POR by detecting the level of the voltage outputted from the power supply circuit 310. The initialization signal generator 320 may include a reference voltage generator 321 and an enable circuit 322. The reference voltage generator 321 may be coupled to the power supply circuit 310, and generate a reference voltage by dividing an output of the power supply circuit 310. The reference voltage generator 321 may generate the reference voltage PORREF by dividing one of the external voltage VCCE and the internal voltage VCCI which are provided from the power supply circuit 310. The reference voltage PORREF may have a lower level than the external voltage VCCE and the internal voltage VCCI. The enable circuit 322 may receive the reference voltage PORREF. The enable circuit 322 may disable the initialization signal POR when the reference voltage PORREF rises to a predetermined level or more.

The power supply circuit 310 may include a first power supply circuit 311 and a second power supply circuit 312. The first power supply circuit 311 may provide one of the external voltage VCCE and the internal voltage VCCI to the reference voltage generator 321 in response to the initialization signal POR. The second power supply circuit 312 may provide one of the external voltage VCCE and the internal voltage VCCI to the enable circuit 322 in response to the initialization signal POR.

The first power supply circuit 311 may include a first switching transistor ST31, a second switching transistor ST32, and an output transistor OT31. For example, the first switching transistor ST31, the second switching transistor ST32, and the output transistor OT31 may all be P-channel MOS transistors. The first switching transistor ST31 may output the external voltage VCCE in response to the initialization signal POR. The first switching transistor ST31 may receive the inverted signal PORB of the initialization signal POR through a gate thereof, and receive the external voltage VCCE through a source thereof. The second switching transistor ST32 may output the internal voltage VCCI in response to the initialization signal POR. The second switching transistor ST32 may receive the initialization signal POR through a gate thereof, and receive the internal voltage VCCI through a source thereof. The output transistor OT31 may receive a ground voltage VSS through a gate thereof, and have a source coupled to the drains of the first and second switching transistors ST31 and ST32 in common and a drain coupled to the reference voltage generator 321. Thus, when the initialization signal POR is enabled, the first switching transistor ST31 may be turned on to provide the external voltage VCCE to the reference voltage generator 321, and when the initialization signal POR is disabled, the second switching transistor ST32 may be turned on the provide the internal voltage VCCI to the reference voltage generator 321.

The second power supply circuit 312 may include third and fourth switching transistors ST33 and ST34. Both of the third and fourth switching transistors ST33 and ST34 may be P-channel MOS transistors. The third switching transistor ST33 may output the external voltage VCCE to the enable circuit 322 in response to the initialization signal POR. The third switching transistor ST33 may receive the inverted signal PORB of the initialization signal POR through a gate thereof, and receive the external voltage VCCE through a source thereof. The fourth switching transistor ST34 may output the internal voltage VCCI to the enable circuit 322 in response to the initialization signal POR. The fourth switching transistor ST34 may receive the initialization signal POR through a gate thereof, receive the internal voltage VCCI through a source thereof, and have a drain coupled to the drain of the third switching transistor ST33. The drains of the third and fourth switching transistors ST33 and ST34 may be coupled to the enable circuit 322. Thus, when the initialization signal POR is enabled, the third switching transistor ST33 may be turned on to provide the external voltage VCCE to the enable circuit 322, and when the initialization signal POR is disabled, the fourth switching transistor ST34 may be turned on to provide the internal voltage VCCI to the enable circuit 322.

The reference voltage generator 321 may include a voltage divider 331 and a voltage level controller 332. The voltage divider 331 may generate the reference voltage PORREF by dividing an output of the first power supply circuit 311. The voltage divider 331 may include a plurality of resistors R coupled in series between the first power supply circuit 311 and a ground voltage VSS. The voltage divider 331 may change the level of the reference voltage PORREF according to the resistance values of the plurality of resistors R. The voltage level controller 332 may change the level of the reference voltage PORREF in response to the initialization signal POR. The voltage level controller 332 may lower the level of the reference voltage PORREF when the initialization signal POR is enabled. The voltage level controller 332 may include a control resistor RC coupled in series to the resistors R of the voltage divider 331 and an NMOS transistor N31 coupled to both terminals of the control resistor RC. The control resistor RC may have a resistance value equal to or different from the plurality of resistors R forming the voltage divider 331. The NMOS transistor N31 may receive the initialization signal POR through a gate thereof and have a drain and source coupled to both terminals of the control resistor RC, respectively. When the initialization signal POR is enabled, the NMOS transistor N31 may be turned on. Then, the resistance value between the first power supply circuit 311 and the ground voltage VSS may be decreased to lower the level of the reference voltage PORREF. When the initialization signal POR is disabled, the NMOS transistor N31 may be turned off. Then, the resistance value between the first power supply circuit 311 and the ground voltage VSS may be increased to raise the level of the reference voltage PORREF.

The enable circuit 322 may include an inverter IV31. The inverter IV31 may be operated by one of the external voltage VCCE and the internal voltage VCCI which are received from the second power supply circuit 312. The inverter IV31 may disable the initialization signal POR when the level of the reference voltage PORREF becomes equal to or more than a predetermined level. The inverter IV31 may enable the initialization signal POR when the level of the reference voltage PORREF becomes less than the predetermined level.

Figure 4:
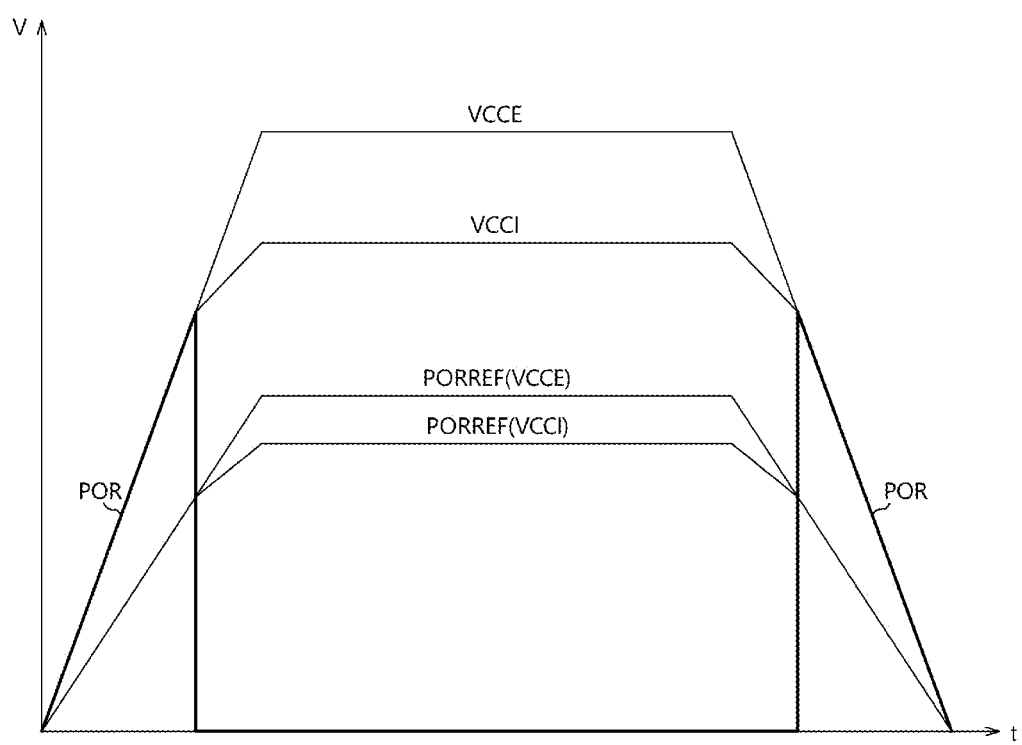
FIG. 4 is a timing diagram illustrating a representation of an example of the operation of the initialization signal generation device of FIG. 3.

FIG. 4 is a timing diagram illustrating a representation of an example of the operation of the initialization signal generation device 300 of FIG. 3. Referring to FIGS. 3 and 4, the operation of the initialization signal generation device 300 according to an embodiment will be described as follows. In the timing diagram, the horizontal axis may indicate the time t, and the vertical axis may indicate the voltage level V. At the initial stage of the operation of the nonvolatile memory apparatus, the external voltage VCCE may be supplied to the nonvolatile memory apparatus, and the levels of the external voltage VCCE and the internal voltage VCCI may rise. The enable circuit 322 may raise the initialization signal POR to a level corresponding to the external voltage VCCE. As the level of the external voltage VCCE rises, the level of the reference voltage PORREF (VCCE) may also rise. The reference voltage PORREF (VCCE) may be generated by dividing the external voltage VCCE. When the external voltage VCCE rises so that the reference voltage PORREF (VCCE) becomes equal to or more than the predetermined level, the enable circuit 322 may disable the initialization signal POR. When the initialization signal POR is disabled, the first and second power supply circuits 311 and 312 may provide the internal voltage VCCI to the initialization signal generator 320, instead of the external voltage VCCE. Therefore, the voltage divider 331 may generate the reference voltage PORREF (VCCI) by dividing the internal voltage VCCI. Then, when the levels of the external voltage VCCE and the internal voltage VCCI fall so that the reference voltage PORREF (VCCI) falls below the predetermined level, the enable circuit 322 may enable the initialization signal POR. Thus, the first and second power supply circuits 311 and 312 may provide the external voltage VCCE to the initialization signal generator 320, instead of the internal voltage VCCI. The level of the initialization signal POR may fall to a level corresponding to the external voltage VCCE. As such, the initialization signal generation device 300 needs to enable the initialization signal POR when the external voltage VCCE becomes equal to or more than a specific level or becomes less than the specific level. For this operation, the initialization signal generator 320 may continuously monitor the level of the external voltage VCCE. After the initialization signal POR is disabled, the initialization signal generator 320 may monitor the level of the internal voltage VCCI instead of the external voltage VCCE, and the level of the reference voltage PORREF (VCCI) generated by dividing the internal voltage VCCI may be lower than the level of the reference voltage PORREF (VCCE) generated by dividing the external voltage VCCE. Thus, the initialization signal generation device 300 can consume lower power, and reduce the power consumption of the nonvolatile memory apparatus.

Figure 5:
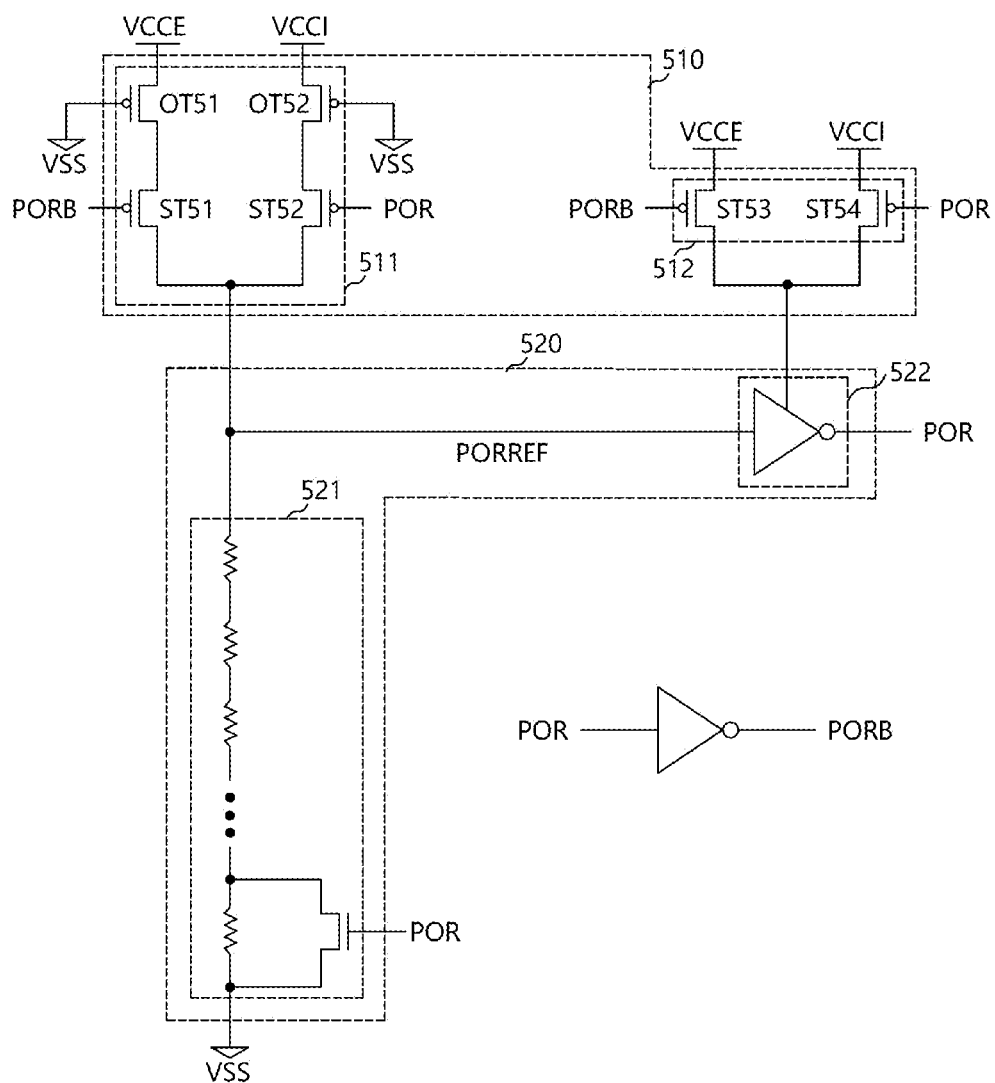
FIG. 5 is a diagram illustrating a representation of an example of the configuration of an initialization signal generation device according to an embodiment.

FIG. 5 is a diagram illustrating a representation of an example of the configuration of an initialization signal generation device 500 according to an embodiment. Referring to FIG. 5, the initialization signal generation device 500 may include a power supply circuit 510 and an initialization signal generator 520. The initialization signal generator 520 may include a reference voltage generator 521 and an enable circuit 522. The reference voltage generator 521 and the enable circuit 522 may be configured in substantially the same manner as those of the initialization signal generator 320 of FIG. 3. Thus, the detailed descriptions of the same components are omitted herein.

The power supply circuit 510 may include first and second power supply circuits 511 and 512. The first power supply circuit 511 may include a first output transistor OT51, a second output transistor OT52, a first switching transistor ST51, and a second switching transistor ST52. The first output transistor OT51, the second output transistor OT52, the first switching transistor ST51, and the second switching transistor ST52 may be P-channel MOS transistors. The first output transistor OT51 may receive a ground voltage VSS through a gate thereof, and receive the external voltage VCCE through a source thereof. The second output transistor OT52 may receive the ground voltage VSS through a gate thereof, and receive the internal voltage VCCI through a source thereof. The first switching transistor ST51 may receive the inverted signal PORB of the initialization signal POR through a gate thereof, and have a source coupled to the drain of the first output transistor OT51. The second switching transistor ST52 may receive the initialization signal POR through a gate thereof, and have a source coupled to the drain of the second output transistor OT52 and a drain coupled to the drain of the first switching transistor ST51. The drains of the first and second switching transistors ST51 and ST52 may be coupled to the reference voltage generator 521.

Referring to FIG. 5, the first and second output transistors OT51 and OT52 may maintain the turn-on state at all times, and the first and second switching transistors ST51 and ST52 may output one of the external voltage VCCE and the internal voltage VCCI to the reference voltage generator 521 according to the initialization signal POR. According to the embodiment of FIG. 3, the first power supply circuit 311 of the initialization signal generation device 300 may have a structure in which the output transistor OT31 is coupled between the reference voltage generator 321 and the first and second switching transistors ST31 and ST32. At this time, the threshold voltage of the output transistor OT31 in the first power supply circuit 311 may be varied according to the level of the reference voltage PORREF. According to the embodiment of FIG. 5, the first power supply circuit 511 may have a structure in which the first and second switching transistors ST51 and ST52 are coupled between the reference voltage generator 521 and the first and second output transistors OT51 and OT52, thereby efficiently preventing variations in threshold voltages of the first and second output transistors OT51 and OT52 according to the level of the reference voltage PORREF.

The second power supply circuit 512 may include third and fourth switching transistors ST53 and ST54. The third switching transistor ST53 may receive the inverted signal PORB of the initialization signal POR through a gate thereof, receive the external voltage VCCE through a source thereof, and have a drain coupled to the enable circuit 522. The fourth switching transistor ST54 may receive the initialization signal POR through a gate thereof, receive the internal voltage VCCI through a source thereof, and have a drain coupled to the enable circuit 522.

Figure 6:
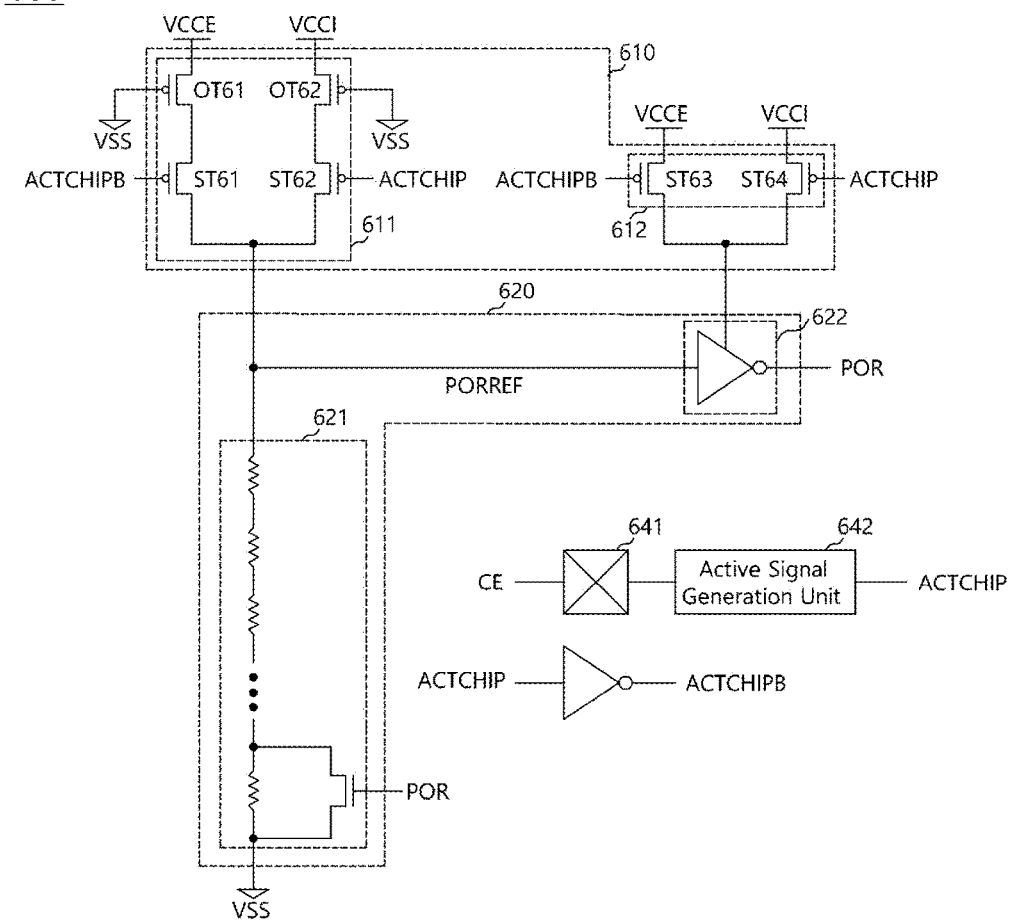
FIG. 6 is a diagram illustrating a representation of an example of the configuration of an initialization signal generation device according to an embodiment.

FIG. 6 is a diagram illustrating a representation of an example of the configuration of an initialization signal generation device 600 according to an embodiment. Referring to FIG. 6, the initialization signal generation device 600 may include a power supply circuit 610 and an initialization signal generator 620. The initialization signal generator 620 may include a reference voltage generator 621 and an enable circuit 622. Since the components of the initialization signal generator 620 are configured in substantially the same manner as those of the initialization signal generator 320 of FIG. 3, the detailed descriptions thereof are omitted herein.

The power supply circuit 610 may provide one of the external voltage VCCE and the internal voltage VCCI in response to an active signal ACTCHIP. The power supply circuit 610 may provide one of the external voltage VCCE and the internal voltage VCCI to the initialization signal generator 620, in response to the active signal ACTCHIP. The active signal ACTCHIP may be generated on the basis of a chip enable signal CE which is inputted to the nonvolatile memory apparatus from outside through a pad 641 and an active signal generation unit 642. The chip enable signal CE may enable the nonvolatile memory apparatus from a sleep state to an active state. The sleep state may include a standby operation mode, a power-down operation mode, and a deep power-down operation mode. The active state may include the active operation mode. In an embodiment, the chip enable signal CE may be enabled to a low level. When the chip enable signal CE received through the pad 641 is enabled, the active signal generation unit 642 may enable the active signal ACTCHIP to a high level.

The power supply circuit 610 may include a first power supply circuit 611 and a second power supply circuit 612. The first power supply circuit 611 may include a first output transistor OT61, a second output transistor OT62, a first switching transistor ST61, and a second switching transistor ST62. All of the first output transistor OT61, the second output transistor OT62, the first switching transistor ST61, and the second switching transistor ST62 may be P-channel MOS transistors. The first output transistor OT61 may receive a ground voltage VSS through a gate thereof, and receive the external voltage VCCE through a source thereof. The second output transistor OT62 may receive the ground voltage VSS through a gate thereof, and receive the internal voltage VCCI through a source thereof. The first switching transistor ST61 may receive the inverted active signal ACTCHIPB of the active signal ACTCHIP through a gate thereof, and have a source coupled to the drain of the first output transistor OT61 and a drain coupled to the reference voltage generator 621. The second switching transistor ST62 may receive the active signal ACTCHIP through a gate thereof, and have a source coupled to the drain of the second output transistor OT62 and a drain coupled to the reference voltage generator 621. Thus, the first power supply circuit 611 may provide the internal voltage VCCI to the reference voltage generator 621 when the active signal ACTCHIP is disabled to a low level, and provide the external voltage VCCE to the reference voltage generator 621 when the active signal ACTCHIP is enabled to a high level.

The second power supply circuit 612 may include third and fourth switching transistors ST63 and ST64. All of the third and fourth switching transistors ST63 and ST64 may be P-channel MOS transistors. The third switching transistor ST63 may receive the inverted the inverted signal ACTCHIPB of the active signal ACTCHIP through a gate thereof, receive the external voltage VCCE through a source thereof, and have a drain coupled to the enable circuit 622. The fourth switching transistor ST64 may receive the active signal ACTCHIP through a gate thereof, receive the internal voltage VCCI through a source thereof, and have a drain coupled to the enable circuit 622. Thus, the second power supply circuit 612 may provide the internal voltage VCCI to the enable circuit 622 when the active signal ACTCHIP is disabled to a low level, and provide the external voltage VCCE to the enable circuit 622 when the active signal ACTCHIP is enabled to a high level. When the nonvolatile memory apparatus is in a sleep state, the initialization signal generator 620 may monitor the level of the internal voltage VCCI and generate the initialization signal POR. Thus, the initialization signal generation device 600 can minimize the power consumption of the nonvolatile memory apparatus in a sleep state.

Figure 7:
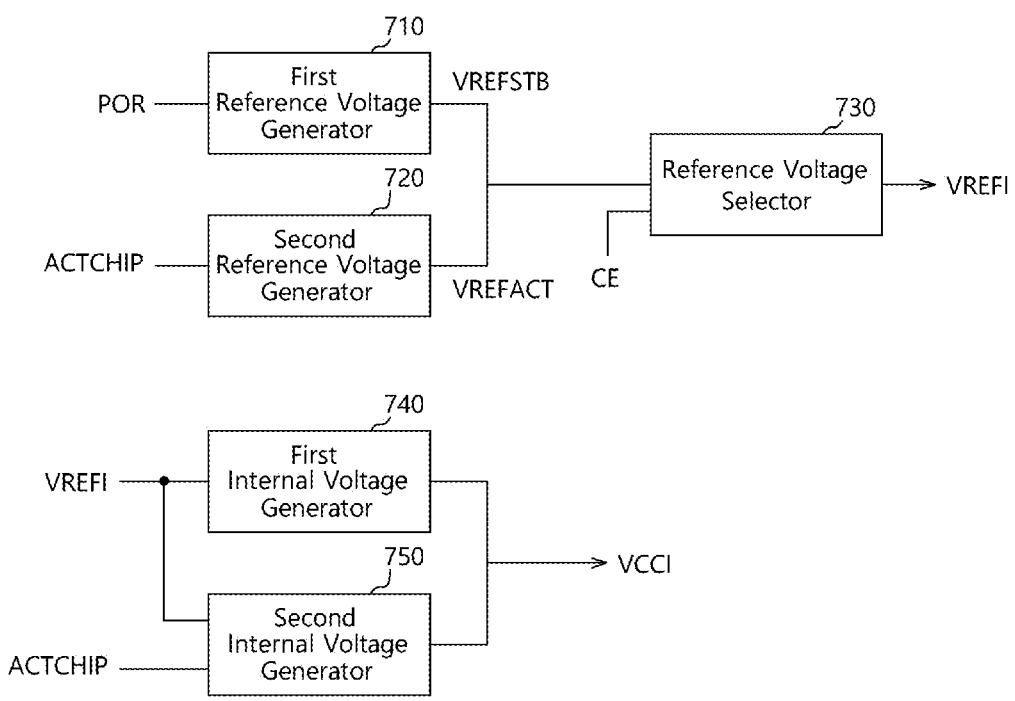
FIG. 7 is a diagram illustrating a representation of an example of the configuration of an internal voltage generation unit according to an embodiment.

FIG. 7 is a diagram illustrating a representation of an example of the configuration of an internal voltage generation unit according to an embodiment. Referring to FIG. 7, the internal voltage generation unit may include a first reference voltage generator 710, a second reference voltage generator 720, a reference voltage selector 730, a first internal voltage generator 740, and a second internal voltage generator 750. The first reference voltage generator 710 may generate a first reference voltage VREFSTB in response to the initialization signal POR. The first reference voltage generator 710 may generate the first reference voltage VREFSTB when the initialization signal POR is disabled to a low level. The first reference voltage generator 710 may generate the first reference voltage VREFSTB when the nonvolatile memory apparatus is in a sleep state. The second reference voltage generator 720 may generate a second reference voltage VREFACT in response to the active signal ACTCHIP. The second reference voltage generator 720 may generate the second reference voltage VREFACT when the active signal ACTCHIP is enabled. The second reference voltage generator 720 may generate the second reference voltage VREFACT when the nonvolatile memory apparatus is in an active state. The second reference voltage generator 720 may generate the second reference voltage VREFACT which precisely corresponds to the target level, compared to the first reference voltage generator 710. The reference voltage selector 730 may output one of the first and second reference voltages VREFSTB and VREFACT as an internal voltage generation reference voltage VREFI in response to a chip enable signal CE. The reference voltage selector 730 may output the second reference voltage VREFACT when the chip enable signal CE is enabled, and output the first reference voltage VREFSTB when the chip enable signal CE is disabled.

The first internal voltage generator 740 may receive the internal voltage generation reference voltage VREFI and generate the internal voltage VCCI. The first internal voltage generator 740 may always generate the internal voltage VCCI regardless of the active signal ACTCHIP. In an embodiment, the first internal voltage generator 740 may not generate the internal voltage VCCI when the active signal ACTCHIP is enabled. The second internal voltage generator 750 may receive the active signal ACTCHIP and the internal voltage generation reference voltage VREFI and generate the internal voltage VCCI. The second internal voltage generator 750 may generate the internal voltage VCCI from the internal voltage generation reference voltage VREFI, when the active signal ACTCHIP is enabled.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. An initialization signal generation device comprising:
a power supply circuit configured to provide an external voltage when an initialization signal is enabled and provide an internal voltage when the initialization signal is disabled and internal circuits are initialized; and
an initialization signal generator configured to sense the level of the voltage outputted from the power supply circuit and generate the initialization signal,
wherein the initialization signal generator comprises a reference voltage generator configured to generate a reference voltage from the output of the power supply circuit, and an enable circuit configured to disable the initialization signal when the level of the reference voltage is equal to or greater than a predetermined level,
wherein the power supply circuit comprises a first power supply circuit configured to provide one of the external voltage and the internal voltage to the reference voltage generator in response to the initialization signal, and a second power supply circuit configured to provide one of the external voltage and the internal voltage to the enable circuit in response to the initialization signal.

2. The initialization signal generation device according to claim 1, wherein the first power supply circuit comprises:
a first switching transistor configured to output the external voltage in response to the initialization signal;
a second switching transistor configured to output the internal voltage in response to the initialization signal; and
an output transistor configured to provide the outputs of the first and second switching transistors to the reference voltage generator.

3. The initialization signal generation device according to claim 2, wherein the second power supply circuit comprises:
a third switching transistor configured to provide the external voltage to the enable circuit in response to the initialization signal; and
a fourth switching transistor configured to provide the internal voltage to the enable circuit in response to the initialization signal.

4. The initialization signal generation device according to claim 1, wherein the first power supply circuit comprises:
a first output transistor configured to output the external voltage;
a second output transistor configured to output the internal voltage;

a first switching transistor configured to provide the output of the first output transistor to the reference voltage generator in response to the initialization signal; and a second switching transistor configured to provide the output of the second output transistor to the reference voltage generator in response to the initialization signal.

5. The initialization signal generation device according to claim 4, wherein the second power supply circuit comprises:
   a third switching transistor configured to provide the external voltage to the enable circuit in response to the initialization signal; and
   a fourth switching transistor configured to provide the internal voltage to the enable circuit in response to the initialization signal.

6. The initialization signal generation device according to claim 4, wherein the first and second switching transistors are coupled between the reference voltage generator and the first and second output transistors to prevent variations in threshold voltages of the first and second output transistors according to the level of the reference voltage.

7. The initialization signal generation device according to claim 1, wherein the reference voltage generator comprises:
   a voltage divider configured to generate the reference voltage by dividing the output of the power supply circuit; and
   a voltage level controller configured to change the level of the reference voltage in response to the initialization signal.

8. An initialization signal generation device comprising:
   a power supply circuit configured to provide one of an external voltage and an internal voltage in response to an active signal, wherein stable level of the internal voltage is lower than stable level of the external voltage;
   an initialization signal generator configured to sense the level of the voltage outputted from the power supply circuit and generate an initialization signal; and
   an internal voltage generation unit configured to generate the internal voltage in response to the initialization signal and the active signal.

9. The initialization signal generation device according to claim 8, wherein the active signal is generated on the basis of a chip enable signal applied from outside.

10. The initialization signal generation device according to claim 8, wherein the power supply circuit provides the external voltage to the initialization signal generator when the active signal is enabled, and provides the internal voltage to the initialization signal generator when the active signal is disabled.

11. The initialization signal generation device according to claim 8, wherein the initialization signal generator comprises:
    a reference voltage generator configured to generate a reference voltage from the output of the power supply circuit; and
    an enable circuit configured to disable the initialization signal when the level of the reference voltage is equal to or greater than a predetermined level.

12. The initialization signal generation device according to claim 11, wherein the power supply circuit comprises:
    a first power supply circuit configured to provide one of the external voltage and the internal voltage to the reference voltage generator in response to the active signal; and
    a second power supply circuit configured to provide one of the external voltage and the internal voltage to the enable circuit in response to the initialization signal.

13. The initialization signal generation device according to claim 12, wherein the first power supply circuit comprises:
    a first output transistor configured to output the external voltage;
    a second output transistor configured to output the internal voltage;
    a first switching transistor configured to provide the output of the first output transistor to the reference voltage generator in response to the initialization signal; and
    a second switching transistor configured to provide the output of the second output transistor to the reference voltage generator in response to the initialization signal.

14. The initialization signal generation device according to claim 13, wherein the second power supply circuit comprises:
    a third switching transistor configured to provide the external voltage to the enable circuit in response to the initialization signal; and
    a fourth switching transistor configured to provide the internal voltage to the enable circuit in response to the initialization signal.

15. The initialization signal generation device according to claim 13, wherein the first and second switching transistors are coupled between the reference voltage generator and the first and second output transistors to prevent variations in threshold voltages of the first and second output transistors according to the level of the reference voltage.

16. The initialization signal generation device according to claim 11, wherein the reference voltage generator comprises:
    a voltage divider configured to generate the reference voltage by dividing the output of the power supply circuit; and
    a voltage level controller configured to change the level of the reference voltage in response to the initialization signal.

* * * * *